(12) United States Patent
Shakya

(10) Patent No.: US 7,265,704 B1
(45) Date of Patent: Sep. 4, 2007

(54) DOMINO ANALOG TO DIGITAL CONVERSION ARCHITECTURE

(76) Inventor: Jyotindra Raj Shakya, 457 Acalanes Dr., #24, Sunnyvale, CA (US) 94086

( * ) Notice: Subject to any disclaimer, the term of this patent is extended or adjusted under 35 U.S.C. 154(b) by 0 days.

(21) Appl. No.: 11/188,471

(22) Filed: Jul. 25, 2005

Related U.S. Application Data

(60) Provisional application No. 60/591,036, filed on Jul. 26, 2004.

(51) Int. Cl.
*H03M 1/34* (2006.01)

(52) U.S. Cl. ........................................ 341/162; 341/155

(58) Field of Classification Search ................ 341/162, 341/159, 120, 155, 143, 144
See application file for complete search history.

(56) References Cited

U.S. PATENT DOCUMENTS 4,947,168 A * 8/1990 Myers ......................... 341/120
6,107,949 A * 8/2000 Gross, Jr. .................... 341/159
6,816,100 B1 * 11/2004 Galton et al. ................ 341/155

* cited by examiner

*Primary Examiner*—Rexford Barnie
*Assistant Examiner*—Joseph Lauture

(57) ABSTRACT

An analog to digital conversion architecture defining a process of converting an analog signal into equivalent digital signal which uses a method comprising of a set of functional units, each capable of performing parametric analog to digital conversion, connected in special arrangement such that each functional unit receives as input a set of parameters which are directly connected to output bits produced by a subset of functional units which are assigned to produce bits of higher significance. The method of analog to digital conversion wherein a function that defines the relationship between the input parameters, analog input value, a given reference value and a set of output bits can be implemented in a single device hence largely simplifying the analog to digital conversion process and making conversion faster and more efficient.

27 Claims, 13 Drawing Sheets

DOMINO ANALOG TO DIGITAL CONVERSION ARCHITECTURE

RELATED APPLICATIONS

This application claims priority of U.S. Provisional Application No. 60/591,036, filed on Jul. 26, 2004, all of which is hereby incorporated by reference in its entirety.

FIELD OF THE INVENTION

The invention relates to an analog to digital conversion architecture defining a process of converting an analog signal into equivalent digital signal using a method comprising of a set of functional units each capable of performing parametric analog to digital conversion.

BACKGROUND OF THE INVENTION

Analog to digital conversion architecture is a functional realization of a process by which any analog signal can be converted into corresponding digital signal. The conversion process can be implemented either as continuous operation or as continuous cycles of operation. In the first case the process comprises of continuous operation of a method of analog to digital conversion which converts instantaneous values of an analog signal into a sequence of approximate digital values. In the second case the process comprises of a continuous cycles of operation of a method of analog to digital conversion which samples the analog signal into a sequence of analog values and converts each analog value into a digital value producing a sequence of digital values which form the digital output signal. In either case the method of analog to digital conversion which converts an analog value into a digital value comprises of a number of functional units each responsible for producing one or more number of bits as a part of overall digital value. When a method produces output bits simultaneously the architecture that uses such method is called parallel architecture. Similarly when a conversion method comprises of a single functional unit which in a number of cycles produces a sequence of output bits which when concatenated forms the overall digital value, the architecture that implements such method is called serial architecture. And an architecture, which uses a method in which a number of functional units are connected in series such that the output bits of each unit produced at different instant of time form the overall digital value, is called pipelined architecture. Besides serial, parallel and pipelined, there are other architectures as well and every architecture has its own advantages and disadvantages. This invention introduces an architecture called Domino Architecture, which is an improvement on pipelined architecture.

In pipelined architecture, the conversion method comprises of several conversion stages. In each conversion stage a functional unit samples the stage input signal, converts the sampled analog value into output bits of approximate digital value, converts the digital value back to analog value, finds an error by computing difference between original analog value and analog equivalent of approximate digital value and amplifies the error before feeding it into the following stage. Hence each functional unit comprises of a sample and hold function, analog to digital conversion function, digital to analog conversion function, analog subtraction function and amplification function. In domino architecture the digital to analog conversion function, subtraction function and amplification function required inside each functional unit are eliminated and the digital signal produced by each functional unit is directly fed into other functional units.

OBJECTS OF THE INVENTION

It is an object of present invention to introduce an architecture which when implemented using all needed functional units and components provides a process of converting analog signal into digital signal using less number of operations such that device implementation becomes simpler and faster than that of a similar device using pipelined architecture. The presented architecture features following advantages over pipelined architecture:
 1. Uses less number of operations to derive the digital value from given analog value hence making device implementation simpler and faster.
 2. Uses a special arrangement of a set of functional units such that output bits of each functional unit is directly fed into other functional units producing bits of lower significance as a set of parameters such that change in output of any functional unit directly and immediately affects the operation of other functional units making the process react faster to changes in analog input signal and making conversion process faster.
 3. Such functional units merely comprises of basic mathematical operations such as scaling, summing and comparing hence each functional unit can be implemented in a single device making device implementation simpler.
 4. Such functional units can be replaced by analog to digital conversion units adapted to perform parametric analog to digital conversion hence different method can be used efficiently using domino architecture taking advantage of such method as per application.
 5. Functional units are connected to each other using digital lines which have a value of either 0 or $S_{REF}$ making device implementation less vulnerable to noise.
 6. Eliminates the need of deriving error signal at each level and amplifying it to be fed into next stage.

Additional objects, advantages and features of this invention will become apparent to those skilled in the art from a consideration of ensuing description and drawings.

SUMMARY OF THE INVENTION

The present invention introduces an analog to digital conversion architecture called domino architecture which defines a process by which an analog signal can be converted into a digital signal. The process when implemented as continuous operation converts an analog signal into digital signal and when implemented as cycles of operation converts analog signal into sequence of analog values by sampling and converts each analog value into digital value to form sequence of digital values which form overall digital output signal. The cycles of operation do not overlap in time while in synchronous mode and overlap in time while in asynchronous mode. In both cases the process uses a method of analog to digital conversion which converts an analog value into an approximate digital value of predetermined number of bits. The method comprises of a number of functional units capable of performing analog mathematical operation which are connected in special arrangement such that each functional unit receives output bits of all other functional units producing bits of higher bit significance as a set of parametric inputs and changes its conversion process as a function of the state of each parameter. In addition to parametric inputs, each functional unit also has an analog input, an analog reference input and set of digital output lines corresponding to output bits. In synchronous operation, the analog input value of all functional units is same and is equal to the original analog value to be converted during the conversion cycle and the parametric inputs receive instantaneous values corresponding to state of output bits of other functional units to which it is connected to. In asynchronous operation the analog input and parametric inputs of each functional unit receive values which are sampled at different instant of time corresponding to different cycles of the conversion process. Regardless of mode of operation, at any instant of time each functional unit derives the state of each output bit as a function of state of each parameter at that time and value of analog input and reference input at that time. The number of output bits in each functional unit can range from 1 to N, where N is the number of bits in overall digital value. Depending on number of bits each functional unit is designed for, a set of functions, which determine the state of each output bit, can be derived mathematically. Hence each functional unit when implemented to perform such mathematical operation on the given analog value and values of each parameter will derive the state of each output bit and hence the overall digital value.

DETAILED DISCLOSURE OF THE INVENTION

In the following description, reference is made to the accompanying drawings, which form a part hereof, and which show, by way of illustration, specific embodiments or processes in which the invention may be practiced. In some instances, specific details are set forth in order to provide a thorough understanding of the present invention. The present invention, however, may be practiced without the specific details or with certain alternative equivalent devices and methods to those described herein. In other instances, well-known methods and devices have not been described in detail so as not to unnecessarily obscure aspects of the present invention.

The present invention discloses an analog to digital conversion architecture called domino architecture, which is functional realization of a process by which an analog signal can be converted into equivalent digital signal. The process when implemented continuously converts instantaneous values of analog signal into equivalent digital values and when implemented as cycles of operation, converts analog signal into sequence of analog values and converts each analog value into equivalent digital value. When in cyclic operation, the process can be run either synchronously or asynchronously. In synchronous mode, each cycle of the process comprises of steps of sampling the analog input signal, holding the sampled value in storage unit, converting sampled analog value into equivalent digital value using a number of functional units running synchronously and storing the digital output value in a storage unit. Since all functional units are converting the same analog value at any time and since they produce output bits which corresponds to same digital value, all functional units share a single sample and hold unit and a single output storage unit. In asynchronous mode each cycle of the process which involves complete conversion of a given analog sample comprises of a number of stages corresponding to each functional unit. Each stage comprises of steps of sampling the analog input signal, converting the sampled analog value into equivalent output bits using one of the functional units and storing output bits into a separate storage unit. The stages run in succession such that at the end of any stage the sampled analog value, output bits from previous stage and output bits produced at that stage is fed into the following stage. The following stage stores outputs bits receives from all previous stages into a series of storage units and hence using output from all previous stages which correspond to a single conversion and corresponding analog value derives the output bits corresponding to that stage. The cycle ends when all the bits have been produced after sampled analog value has been processed at each functional unit.

Figure 1:
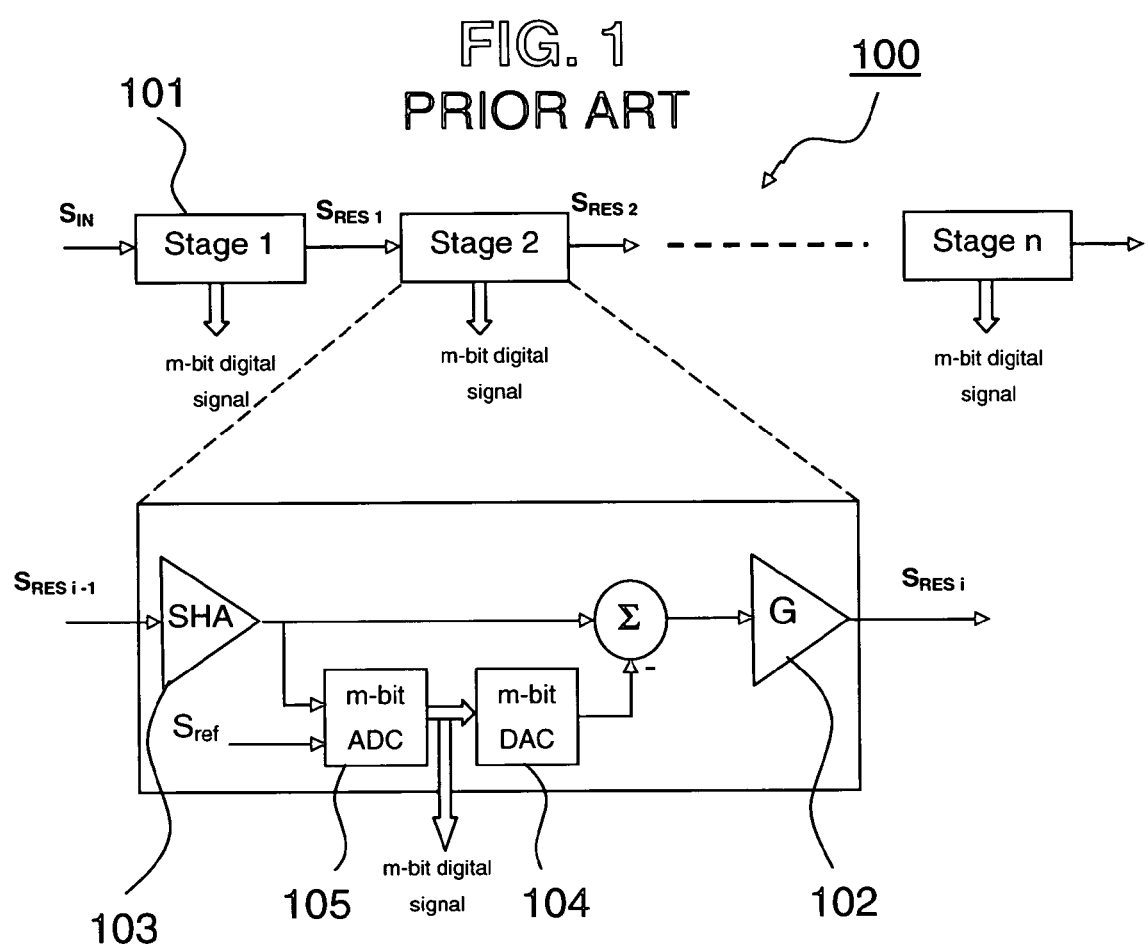
FIG. 1 illustrates n stage analog to digital converter based on pipelined architecture with m-bits per functional unit producing m×n bit digital output signal.
Figure 2:
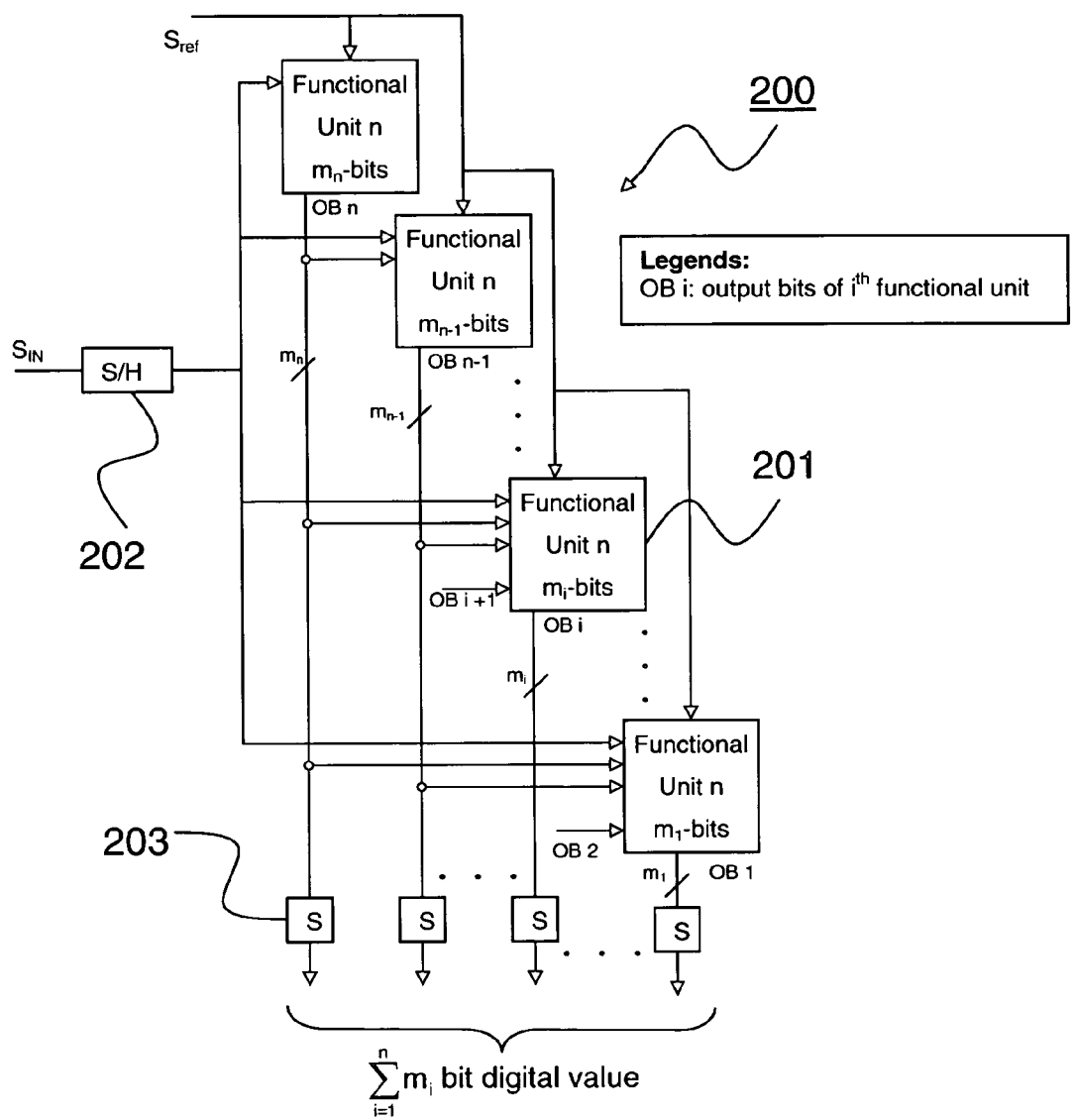
FIG. 2 shows the functional block diagram of an analog to digital converter based on domino architecture with n different functional units running in synchronous mode.
Figure 3:
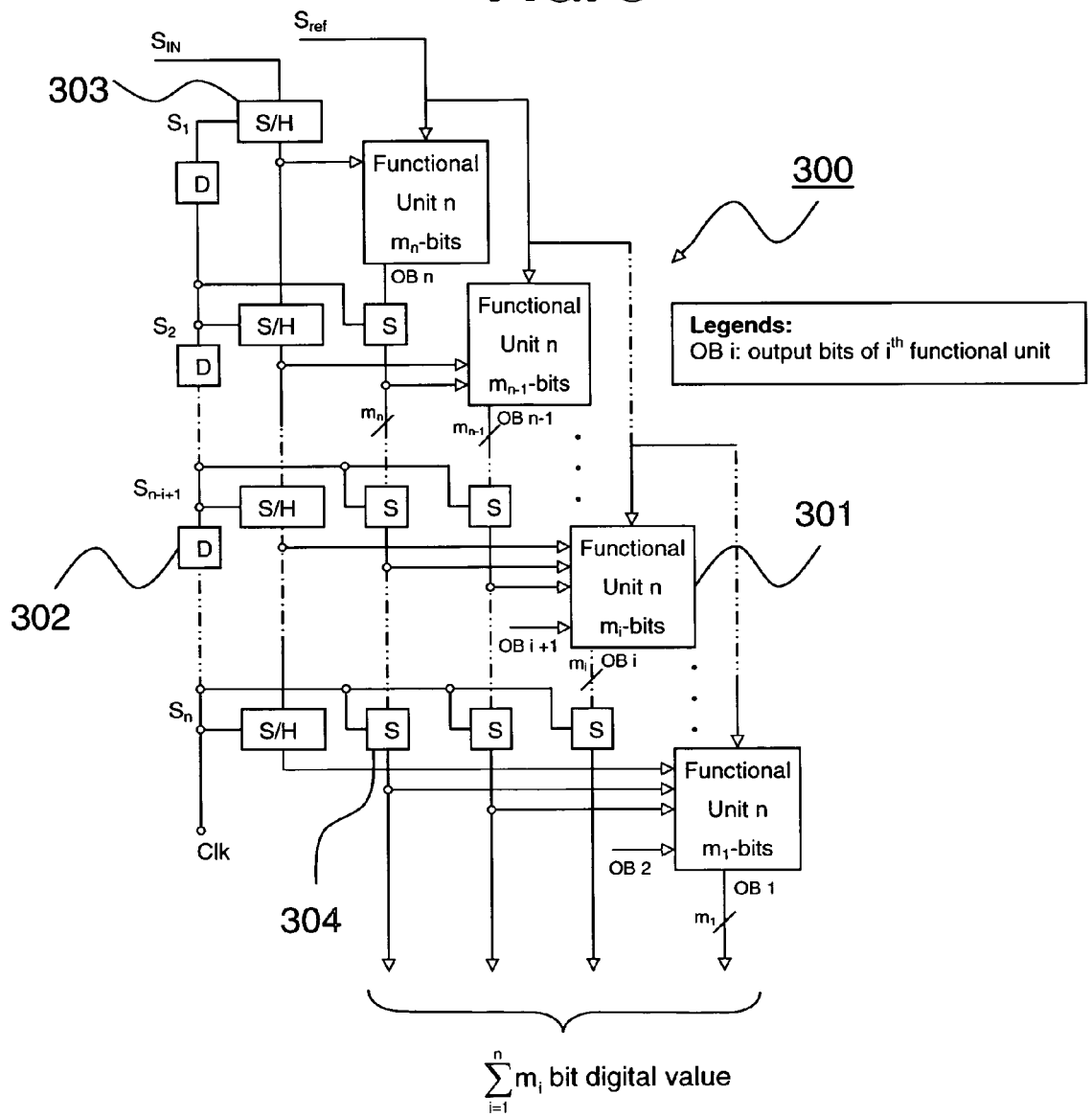
FIG. 3 shows the functional block diagram of analog to digital converter based on domino architecture with n different functional units running in asynchronous mode.

In both synchronous and asynchronous operation, the process uses a method of analog to digital conversion which has a number of functional units which are connected in special arrangement as shown in FIG. 2 and FIG. 3 respectively such that each functional unit receives the output bits (OB) from other functional units producing bits of higher significance. In addition each functional unit also has an analog input $S_{IN}$, reference input $S_{REF}$ and a number of digital output lines corresponding to output bits. The functional unit computes the values of output bits as a function of digital inputs, reference input and given analog input value. The functional relationship between inputs and outputs of $i^{th}$ functional unit can be expressed mathematically as in FIG. 3. Each functional unit can also be an analog to digital converter deriving the values of each output bit based on analog input value, reference value and values of the set of parameters. Hence, in general, each functional unit is a parametric analog to digital converter.

In a specific process designed to convert a sequence of analog values into sequence of digital values in a sequence of cycles in synchronous mode using a method designed to produce N bit digital value for each analog value using n different functional units each producing $m_i$ output bits the state of each output bit, $b_k$ can be expressed as:

$$b_k = \begin{cases} \text{comp}\left(S_{IN}, \dfrac{S_{REF}}{2}\right) & \text{for } k = N-1 \\ \text{comp}\left(S_{IN}, \dfrac{S_{REF}}{2^{N-k}} + \displaystyle\sum_{j=k+1}^{N-1} \dfrac{b_j}{2^{N-j}}\right) & \text{for } k \ne N-1 \end{cases} \quad \text{Eq I}$$

where, $$\text{comp}(a,b) = \begin{cases} S_{REF} & a > b \\ 0 & a \le b \end{cases}, \quad \text{Eq II}$$

k=0 to N−1,
$S_{IN}$=analog value to be converted,
and
$S_{REF}$=given reference value corresponding to the analog input value that generates maximum digital value +1.

When referring to the output bits ($b_k$) generated by $i^{th}$ functional unit, the index k can be redefined as:

$$k = \left(\sum_{v=1}^{i-1} m_v\right) \text{ to } \left(\sum_{v=1}^{i} m_v\right) - 1$$

where,
$m_v$=number of bits produced by $v^{th}$ functional unit.

Figure 6:
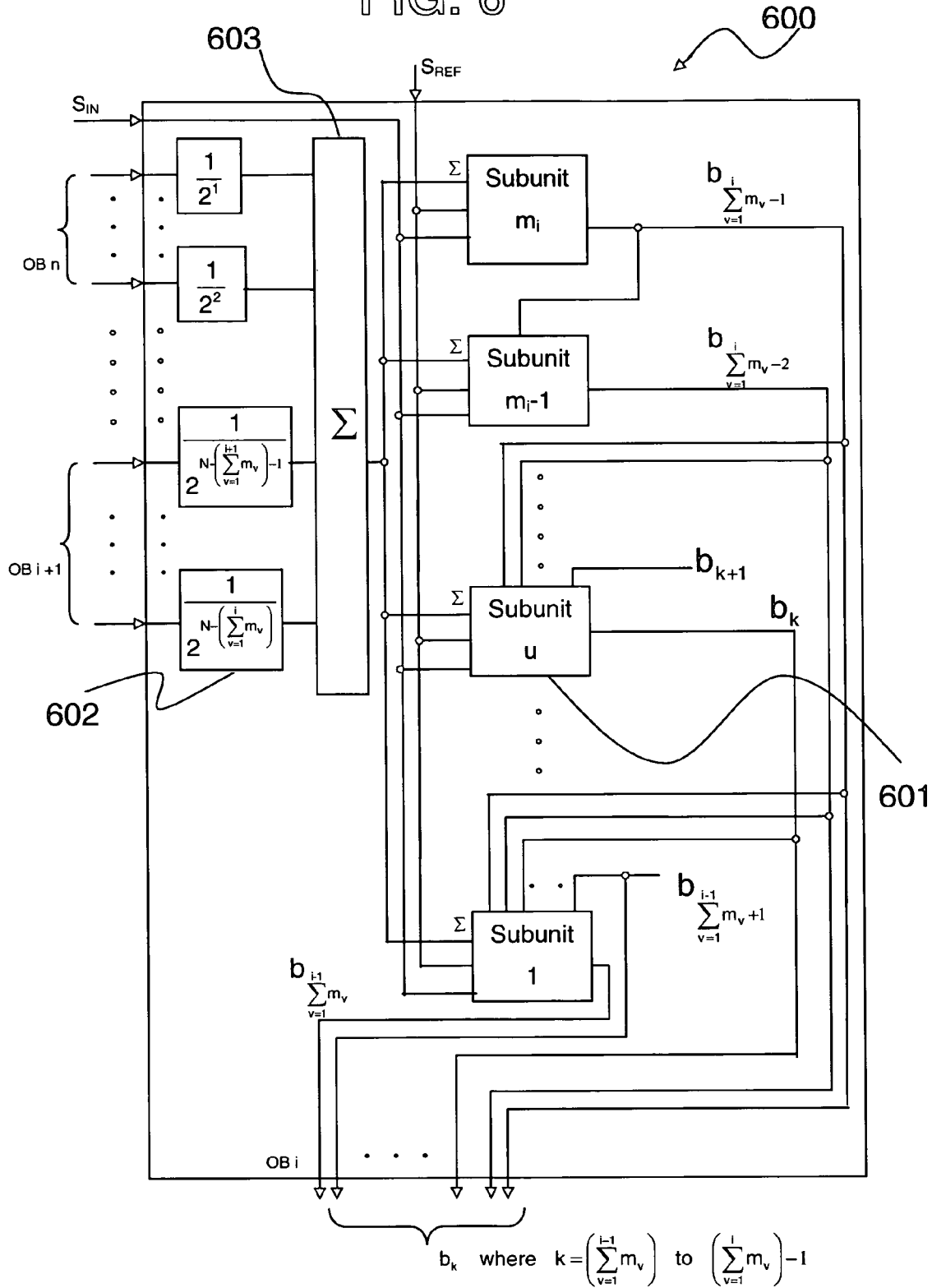
FIG. 6 shows the functional block diagram of $i^{th}$ functional unit capable of producing $m_i$ output bits.
Figure 7:
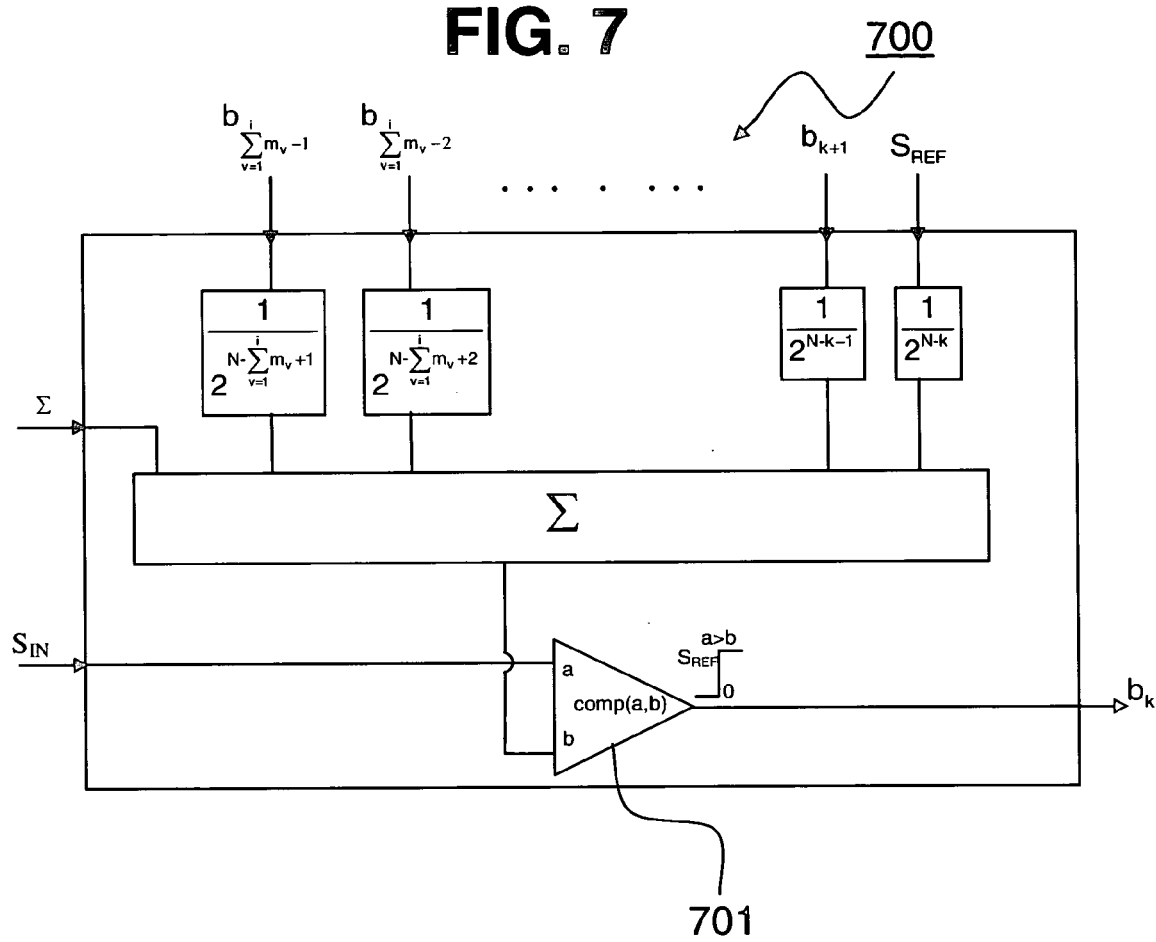
FIG. 7 shows the functional block diagram of $u^{th}$ subunit inside $i^{th}$ functional unit producing a single bit by comparing the input analog value $S_{IN}$ with the result of summation operation.

Each functional unit can be implemented using simple mathematical operations such as multiplication, summation and comparison. For convenience of explaining, the functionality of each functional unit is divided into a set of subunits such that the summation operation is partially done in the functional unit and partially done inside each subunit eventually producing the overall sum which is then compared to the analog input value according to Eq I. The comparison is done in $m_i$ different subunits each deriving a bit which form the output bits of the functional unit. Each subunit is connected in an arrangement as in FIG. 6 similar to that of functional units such that each subunit receives as input the analog input voltage $S_{IN}$, reference voltage $S_{REF}$, the result of partial summation performed in the functional unit Σ and parameters corresponding to bits of higher significance produced by other subunits within the same functional unit. After scaling each parametric input by an appropriate factor as in FIG. 7, the result of partial summation of parent functional unit is added with the scaled values of each parametric inputs and scaled reference input. The result of summation is then compared with the analog input signal such that the comparison result is 0 if $S_{IN}$ is smaller and $S_{REF}$ if $S_{IN}$ is larger. Hence the result of comparison inside each subunit of each functional unit produces bits corresponding to overall equivalent digital value of the given analog input value.

Figure 4:
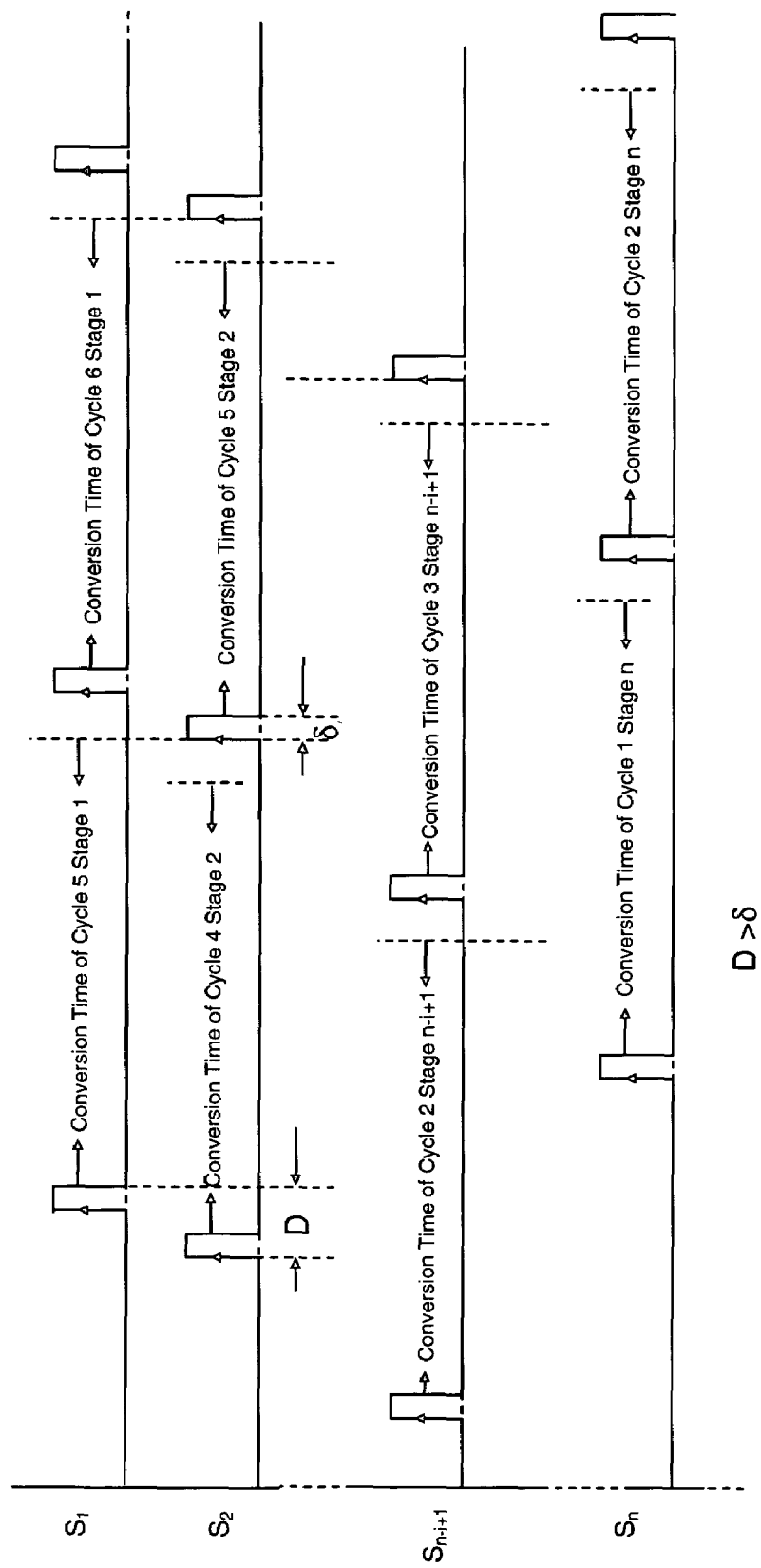
FIG. 4 shows the timing diagram of clock pulses needed for different functional units running in asynchronous mode represented by FIG. 3.
Figure 5:
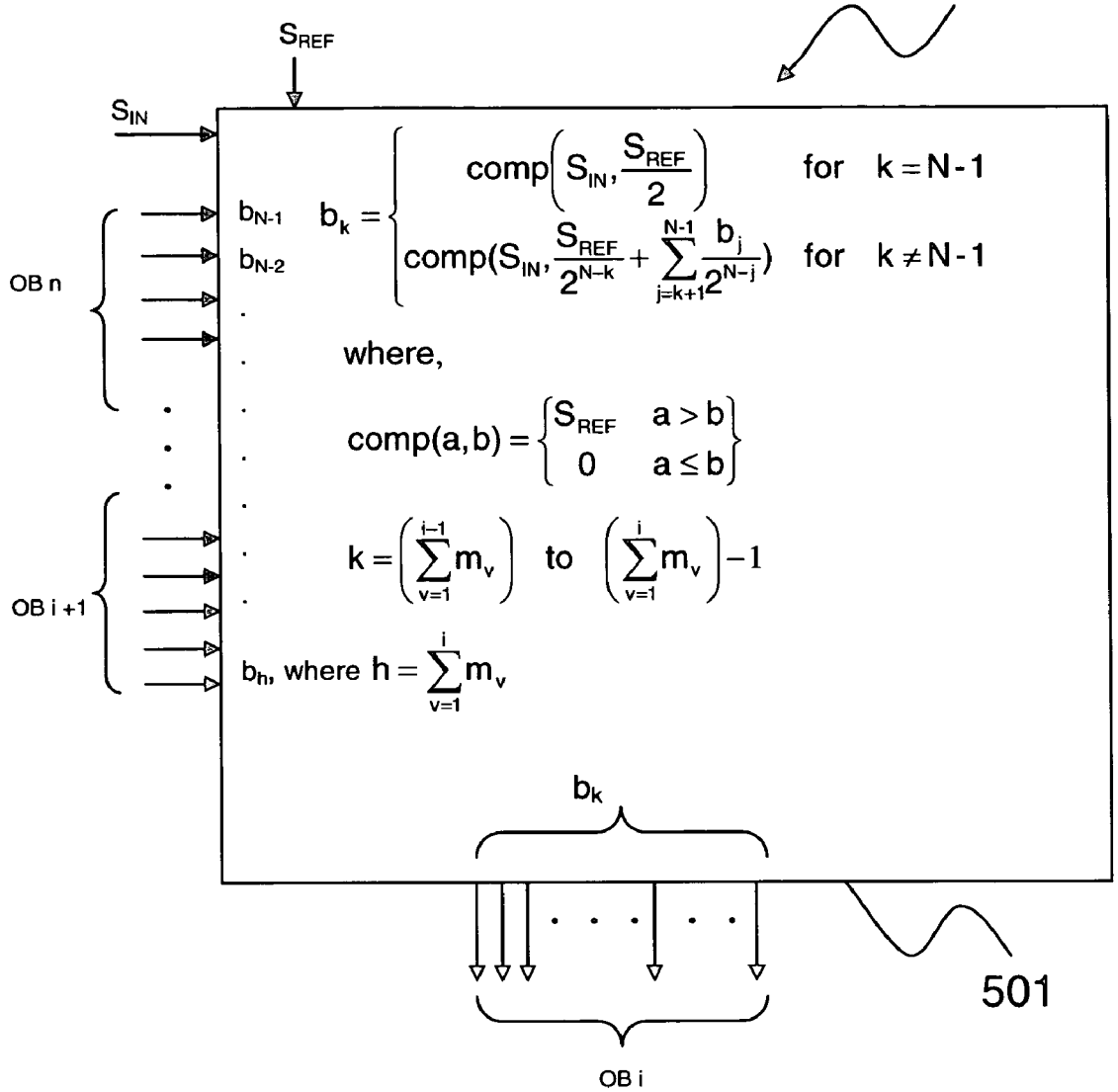
FIG. 5 shows the mathematical model of a preferred embodiment of $i^{th}$ functional unit.

In synchronous operation, all functional units and hence subunits will be converting the same analog input value but at different significance levels such that outputs bits from all functional units form the overall digital value. In asynchronous operation the cycles overlap as in FIG. 4, such that each individual stage of the method comprising of a functional unit, sample and hold unit and a number of storage units, will be converting different analog values corresponding to different cycles. As indicated in FIG. 4, the conversion time of stage cycle 5 stage 2 coincide with conversion time of cycle 6 stage 1 and so forth. In asynchronous operation all the functional blocks are on the process of conversion and hence give the maximum conversion rate.

As with any other architecture or functional realization of a method, domino architecture can be implemented to convert an analog signal to a digital signal, where the analog and digital signal are represented by different physical quantities such as voltage, current, charge, light intensity, electric field, magnetic field etc. provided all functional blocks that are required parts of the architecture exist. Among different possible embodiments, a detailed description and operation of a device using domino architecture is presented.

Figure 8:
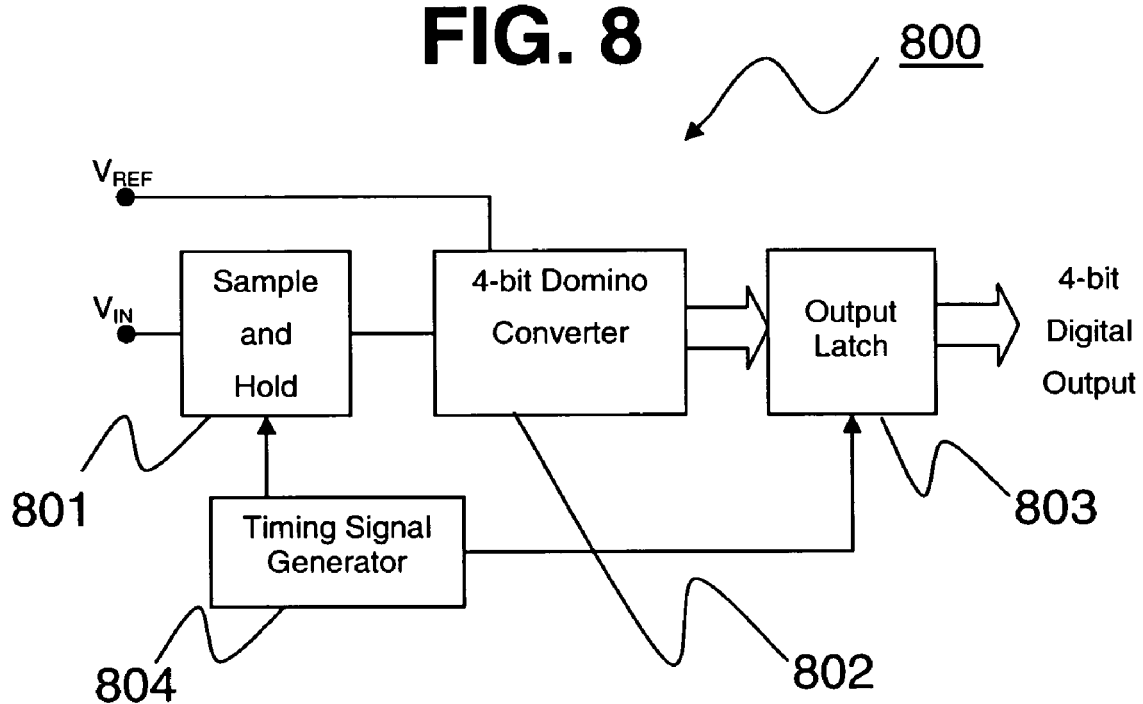
FIG. 8 shows first preferred embodiment of 4-bit analog to digital converter running in synchronous mode using 4-bit domino converter based on domino architecture.

As a preferred embodiment of domino architecture, FIG. 8 presents a 4-bit analog to digital converter called 4-bit domino converter designed to convert an analog voltage signal into digital voltage signal. A similar device implementation is possible for N-bit analog to digital converter using domino architecture. Also a similar device implementation for analog to digital conversion to convert current signals is also possible. In the domino converter of FIG. 8, an analog voltage signal $V_{IN}$ is sampled at a given sample rate using sample and hold circuit 801. The output of sample and hold circuit which is a sequence of analog voltage samples is then converter to 4-bit digital value using domino converter 802. A detailed circuit diagram of the 4-bit domino converter is given in FIG. 9. And the digital output of domino converter is stored in output latch circuit 803 before converting next sample. A timing circuit 804 provides required timing signals for sample and hold circuit and output latch. Besides a reference voltage $V_{REF}$ is provided to domino converter such that it is equal to the maximum voltage produced by comparators 901, 902, 903 and 904.

The domino converter 900 comprises of four analog voltage comparators each designed to output 0 volts when negative input is greater than positive input and $V_{REF}$ when positive input is greater than negative input. The input voltage sample, $V_I$ is first compared with $V_{REF}/2$ using comparator 901, which outputs either $V_{REF}$ or 0 volt depending on whether $V_{IN}$ is greater than $V_I$. Since the output of 901 is connected to 902, 903 and 904 the negative input voltage of 902, 903 and 904 changes according to the output of 901. As an specific example, when input voltage, $V_I$ is 10.5 volts and $V_{REF}$=16 volts, in a state when all comparator outputs are 0 volts the negative input voltage of comparator 901 is 8 volts, that of comparator 902 is 4 volts, that of comparator 903 is 2 volts and that of comparator 904 is 1 volt. The input voltage $V_I$ is then simultaneously compared with 8 volts by comparator 901, with 4 volts by comparator 902, with 2 volts by comparator 903 and with 1 volt by comparator 904. Since 10.5 volt is greater than 8 volt, the comparator 901 outputs 16 volt and for similar reason comparator 902, 903 and 904 outputs 16 volts. Since the inputs of 901 didn't change, the output of 901 stays at 16 volt. But since output of 901 is connected to negative inputs of 902, 903 and 904, output of 902 is connected to 903 and 904 and output of 903 is connected to 904, the negative input voltage for 902, 903 and 904 changes to 12, 14 and 15 volts respectively according to the circuit in FIG. 9. Since $V_I$ which is 10.5 volts is smaller than 12 volts, the output of comparator 902 becomes 0 volts. As a result of change in output of 902 the negative input voltage of 903 and 904 now becomes 10 and 11 volts respectively. Since the inputs of 902 are unchanged the output of 902 stays at 0. Since 10.5 volts is greater than 10 volt output of 903 stays at 16 volts and since 10.5 volts is smaller than 11 volts output of 904 becomes 0 volts. Hence after a short time depending upon the speed of comparator circuitry, the domino converter comes to a stable state of 16 volts, 0 volts, 16 volts and 0 volts with corresponding digital value of 1010, which is the closest digital approximation of 10.5 volts with reference to 16 volts. At this stable state the negative input voltages of 901, 902, 903 and 904 are 8, 12, 10 and 11 respectively, which can be individually derived as a function of output bits $b_0$, $b1$, $b2$ and $b_3$ as below:

For the present example, N=4, $V_{REF}$=16 volts, $V_{IN}$=10.5 volts, and K=0 to N−1=0,1,2,3

Using summation portion of general Eq I, the negative input voltage of $k^{th}$ comparator, $$V_k^- = \begin{cases} \dfrac{V_{REF}}{2} & \text{for } k = N-1 \\ \dfrac{V_{REF}}{2^{N-k}} + \sum_{j=k+1}^{N-1} \dfrac{b_j}{2^{N-j}} & \text{for } k \neq N-1 \end{cases}.$$

And substituting the values of k, we get, $$V_{901}^- = V_3^- = \frac{V_{REF}}{2} = \frac{16}{2} = 8 \text{ volts}$$

$$V_{902}^- = V_2^- = \frac{V_{REF}}{2^{4-2}} + \sum_{j=2+1}^{4-1} \frac{b_j}{2^{4-j}} = \frac{16}{4} + \frac{b_3}{2} = 4 + \frac{16}{2} = 12 \text{ volts}$$

$$V_{903}^- =$$

$$V_1^- = \frac{V_{REF}}{2^{4-1}} + \sum_{j=1+1}^{4-1} \frac{b_j}{2^{4-j}} = \frac{16}{8} + \frac{b_2}{2^{4-2}} + \frac{b_3}{2^{4-3}} = 2 + 0 + \frac{16}{2} = 10 \text{ volts}$$

$$V_{904}^- = V_0^- = \frac{V_{REF}}{2^{4-0}} + \sum_{j=0+1}^{4-1} \frac{b_j}{2^{4-j}} =$$

$$\frac{16}{16} + \frac{b_1}{2^{4-1}} + \frac{b_2}{2^{4-2}} + \frac{b_3}{2^{4-3}} = 1 + \frac{16}{2^3} + 0 + \frac{16}{2} = 11 \text{ volts}$$

Figure 9:
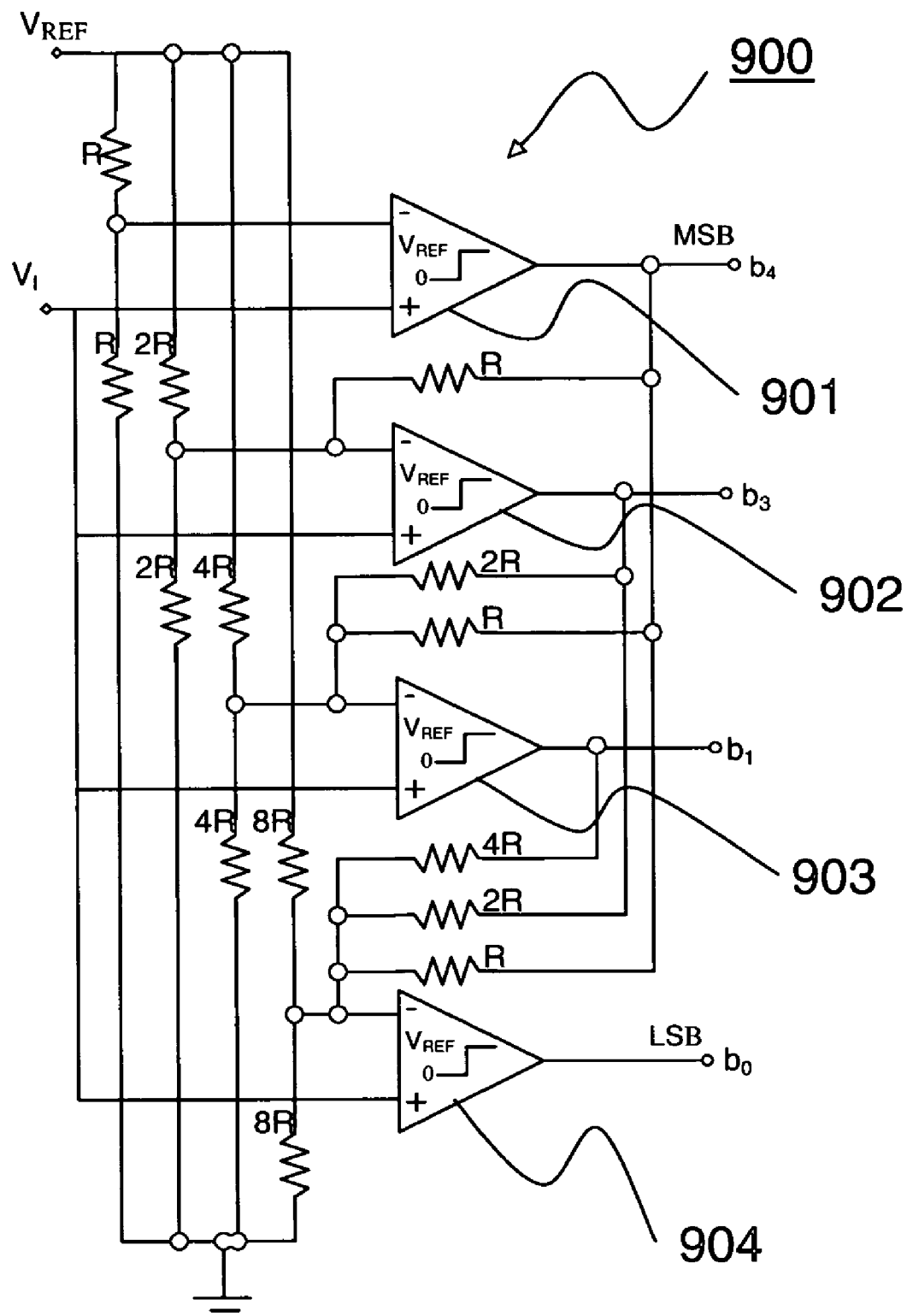
FIG. 9 shows a circuit implementation of 4-bit domino converter in preferred embodiment of FIG. 8.

Also using Eq I, $$b_k = \begin{cases} \text{comp}\left(V_{IN}, \dfrac{V_{REF}}{2}\right) = \text{comp}(V_{IN}, V_k^-) & \text{for } k = N-1 \\ \text{comp}\left(V_{IN}, \dfrac{V_{REF}}{2^{N-k}} + \sum_{j=k+1}^{N-1} \dfrac{b_j}{2^{N-j}}\right) = \text{comp}(V_{IN}, V_k^-) & \text{for } k \neq N-1 \end{cases}$$

and substituting corresponding $V_k^-$, we get $b_3$=comp($V_{IN}$,$V_3^-$)=comp(10.5,8)=16 volts $b_2$=comp($V_{IN}$,$V_2^-$)=comp(10.5,12)=0 volts $b_1$=comp($V_{IN}$,$V_1^-$)=comp(10.5,10)=16 volts $b_0$=comp($V_{IN}$,$V_0^-$)=comp(10.5,11)=0 volts After a given period of time needed for the solution to converge the output attains 1010, and the output of the converter is latched to the output latch 803. The process repeats with a new cycle by sampling next analog voltage. Hence in numerous continuous cycles of operation the input analog voltage signal is continuously converted to sequence of digital values. The comparators 901, 902, 903 and 904 can be implemented using any voltage comparison circuit. The overall performance of domino converter depends on speed of comparator circuitry and hence depending on application different types of comparators can be designed to suit the desired application. The simplicity and efficiency of domino converter of FIG. 8 and FIG. 9 presents the noble features of domino architecture as it pertains to device implementation. Also more simpler and integrated implementations are possible including a single integrated circuit capable of providing scaling function, addition function and comparing function as per the requirements of domino architecture.

Figure 10:
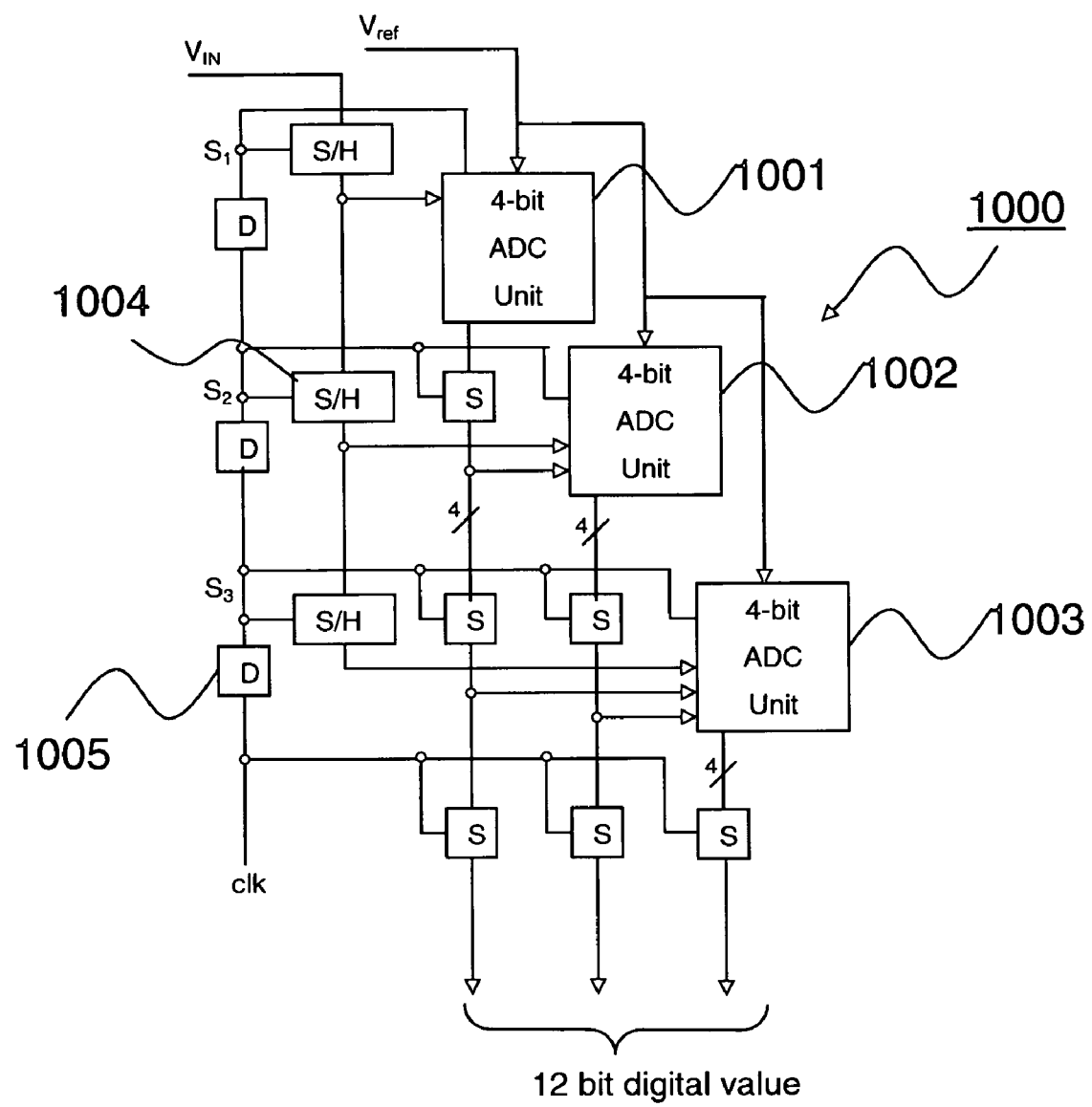
FIG. 10 shows second preferred embodiment of domino architecture with three 4-bit analog to digital converter units.
Figure 11:
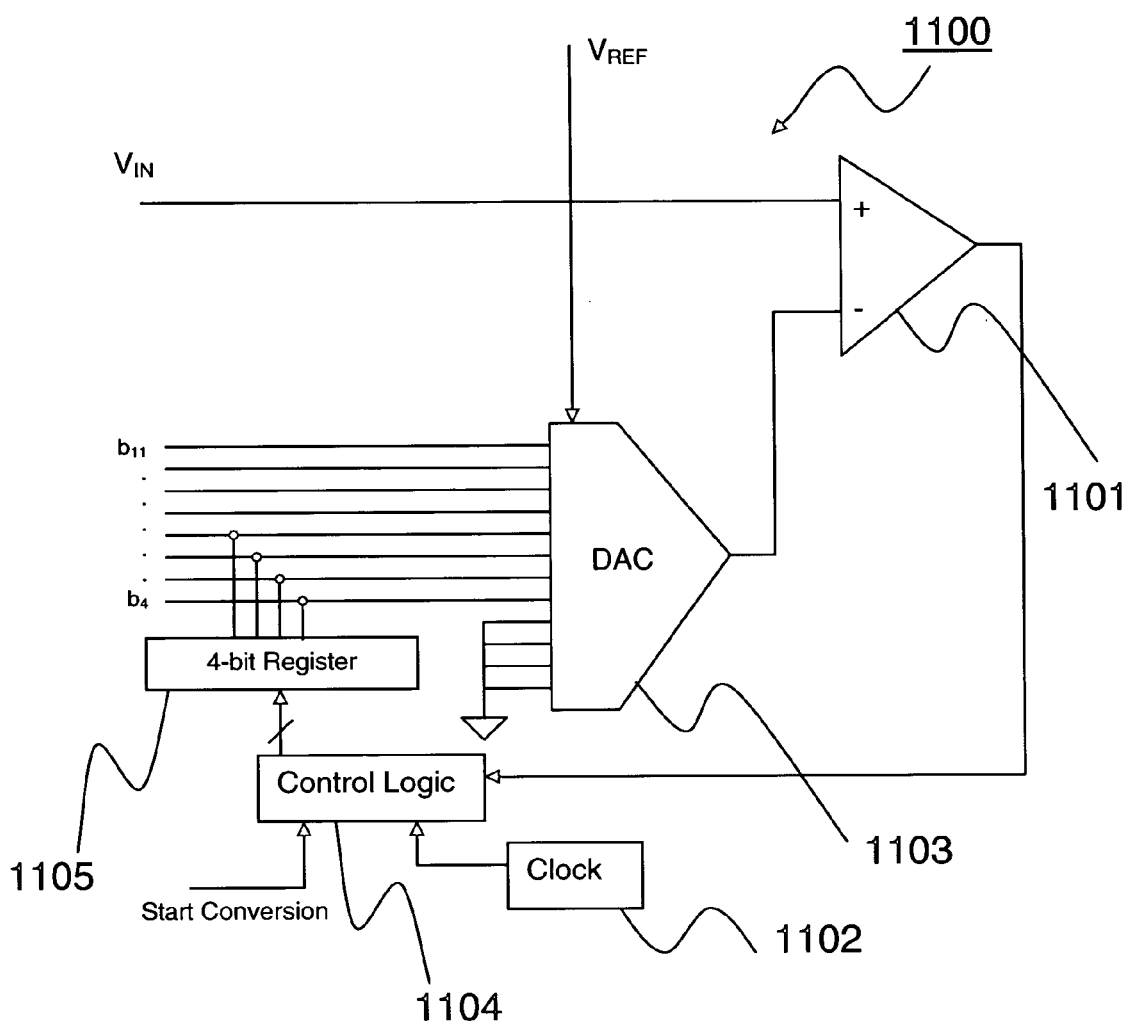
FIG. 11 shows an implementation of one of the 4-bit ADC units in FIG. 10 using the method of successive approximation.

As a second preferred embodiment of domino architecture, FIG. 10 presents a domino converter designed to operate in asynchronous mode with three functional units, each acting as parametric analog to digital conversion units. The ADC units 1001, 1002 and 1003 are 4-bit analog to digital converters which are connected to each other as shown is FIG. 10 such that output bits of 1001 ($b_{11}b_{10}b_9b_8$) are fed into ADC unit 1002 and 1003 as a set of parameters and output bits of 1002 ($b_7b_6b_5b_4$) are fed into ADC unit 1003 as a set of parameters causing the conversion process of ADC unit 1003 depend on output bits of ADC units 1001 and 1002 and the conversion process of ADC unit 1002 depend in ADC unit 1001. Since the present embodiment is designed to operate in asynchronous mode the samples and the output bits are rippled down from ADC unit 1001 to ADC unit 1002 and from ADC unit 1002 to ADC unit 1003 hence each cycle of conversion being accomplished using three stages. A clock signal is generated by external clock source and is delayed by delay units D in succession going from one stage to another as shown in FIG. 8. The sample and hold circuit 1004, corresponding to second ADC unit receives samples from sample and hold circuit of previous stage at rising edge of clock signal $S_2$ and sample and hold circuit of ADC unit 1003 receives samples from sample and hold circuit 1004 at rising edge of clock pulse $S_3$. The clock signal $S_1$, $S_2$ and $S_3$ are similar to that shown in general timing diagram of FIG. 4. Similarly latches indicated in FIG by S, latch the input value into storage unit at rising edge of corresponding clock pulse. Also ADC units 1001, 1002 and 1003 are provided with a clock pulse, the falling edge of which informs corresponding ADCs to start the conversion process. ADC units 1001, 1002 and 1003 can be implemented using any analog to digital conversion technique and for specific illustration an implementation of ADC unit 1002 is shown in FIG. 11. ADC unit of FIG. 11 corresponding to ADC unit 1002 in FIG. 10 is a successive approximation analog to digital conversion adapted to work inside domino architecture. The ADC of FIG. 11 has a clock generator 1102, control logic 1104, a 4-bit register 1105, a 12-bit DAC 1103 and a comparator 1101. The operation of SAR 1100 is similar to that of any other successive approximation ADC except that the DAC receives part of its digital input from external source, which in present case are output bits from ADC unit 1001. The bits that are assigned to current ADC unit, in this case $b_7b_6b_5b_4$, are sequentially set by control logic 1104 and corresponding analog value produced by DAC 1103 is compared with given analog value $V_{IN}$ to decide whether or not each bit should stay high. The remaining inputs to DAC 1103 which are of lower significance are all grounded. Hence depending on the input parameters, which are output bits of ADC unit 1001, ADC unit 1100 performs conversion at different voltage range. The implementation of ADC units 1001 and 1003 are similar to ADC unit 1002 except that in ADC unit 1001, $b_{11}b_{10}b_9b_8$ are sequentially set by the control logic and all remaining bits are grounded and in ADC unit 1003, $b_3 b_2 b_1 b_0$ are sequentially set and tested by control logic and remaining bits of higher significance are obtained from ADC unit 1002 and 1001. An analog sample after being processed through each ADC unit is converted into approximate 12-bit digital value.

Figure 12:
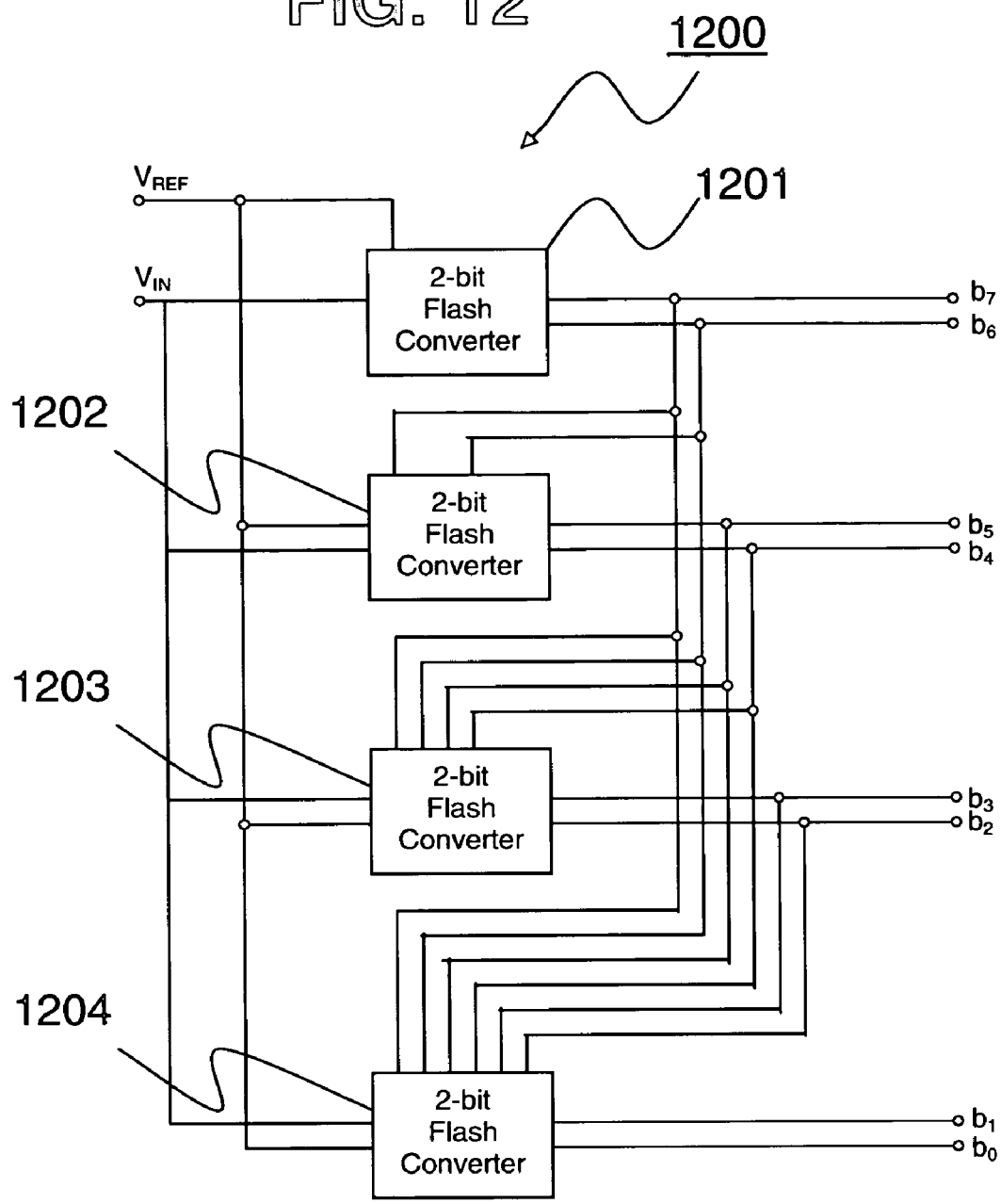
FIG. 12 shows third preferred embodiment of domino architecture using four 2-bit ADC units.
Figure 13:
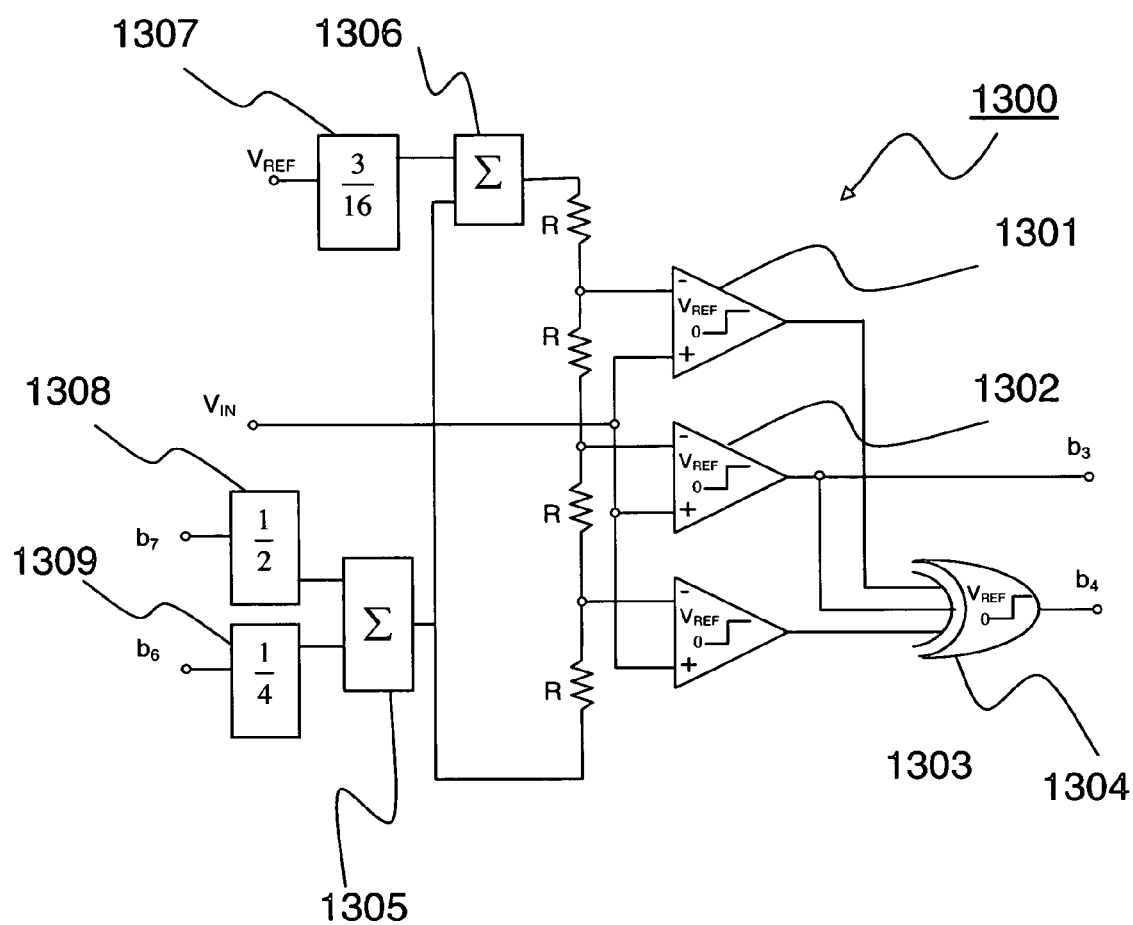
FIG. 13 shows an implementation of one of the ADC units of FIG. 12 using flash converter.

As a third preferred embodiment of domino architecture, FIG. 12 presents an analog to digital converter running in synchronous mode with four 2-bit Flash ADC units connected as per domino architecture. The analog to digital converter of FIG. 12 can also be run is asynchronous mode similar structure to that FIG. 10. The flash converters 1201, 1202, 1203 and 1204 are connected such that output of each converter is directly fed into subsequent flash converters as a set of parameters. The flash converter 1201, 1202, 1203 and 1204 are adapted in order to take into effect the values of each parameter as shown in FIG. 13. The flash converter of FIG. 13 corresponds to flash converter 1202 in FIG. 12 and similar implementation can be designed for flash converters 1201, 1203 and 1204. In flash converter 1202 shown in FIG. 13, the input parameters are scaled and summed to produce the lower reference voltage of the flash converter and a constant value corresponding to the converter in question is added to the lower reference to produce the upper reference so that the flash converter converts voltages at different levels according to the values of given parameters. For example when the analog voltage is 2.31 volts and reference voltage is 5.12 volts, the values of output bit $b_7$ and $b_6$ are 0 and 1 respectively. And corresponding analog values received at converter 1202 is 0 volt and 5.12 volts. After scaling by 0.5 and 0.25 respectively and summing both values we get 1.28 as lower reference value to which 0.96 volts is added to get 2.24 volts as upper reference. Since the analog value is greater than both reference values $b_4$ and $b_3$ are both set to 1. Hence inside flash converter 1203, after each parameter being scaled by 0.5, 0.25, 0.125 and 0.0625, the corresponding values become 0 volts, 1.28 volts, 0.64 volts and 0.32 volts, which are summing gives 2.24 as lower reference value and after adding 0.24 we get 2.48 as upper reference. Since given analog value is equal to 2.31 volts, which lies between 2.3 and 2.36, bit $b_3$ and bit $b_2$ are set to 0 and 1 respectively. Again inside converter 1204, after all parameters being scaled and summed the lower reference is set to 2.32 volts and upper reference is set to 2.38 volts and since analog value is less than both references bit $b_1$ and $b_0$ are both set to 0. Hence the overall conversion result is 01110100 which is the closest digital value corresponding to 2.31 volts with respect to 5.12 volts reference.

While a number of preferred embodiments have been described and shown in the accompanying drawings, it is to be understood that such embodiments are merely illustrative of, and not restrictive on, the scope of present invention. Other embodiments that are apparent to those of ordinary skill in the art, including embodiments that do not provide all of the features and advantages set forth herein, are also within the scope of this invention. Further, it is to be understood that this invention is not limited to the specific construction and arrangements shown and described since various modifications or changes may occur to those of ordinary skill in the art without departing from the spirit and scope of the invention. Accordingly, the scope of the invention is defined by the claims that follow.

What is claimed is:

1. An analog to digital conversion architecture defining a method of converting an analog signal into a sequence of equivalent digital values forming equivalent digital signal, the Analog to digital conversion architecture comprising:

of inter alia a plurality of analog to digital conversion units each capable of converting an analog value into a set of output bits based on a set of parameters and a given reference value;

wherein each conversion unit is assigned to produce said set of output bits which become part of said equivalent digital value;

wherein each conversion unit is directly connected to other conversion units assigned to produce bits of higher significance such that said set of parameters of each conversion unit are assigned analog values of said set of output bits from other conversion units to which it is connected to;

thereby each conversion unit performing parametric analog to digital conversion of said analog signal based on said set of parameters and said reference value.

2. The analog to digital conversion method of claim 1 wherein said set of parameters are scaled according their significance in said digital value and summed to produce a partial sum.

3. The analog to digital conversion method of claim 2 wherein inside each conversion unit, said partial sum is summed with the reference value scaled by a predetermined factor to derive an overall sum which is used as reference value for the said conversion unit.

4. A method of converting an analog value into a N-bit digital value based on a given reference value comprising the steps of deriving the value of each bit $b_k$ according to the mathematical formula:

$$b_k = \begin{cases} \text{comp}\left(S_{IN}, \dfrac{S_{REF}}{2}\right) & \text{for } k = N-1 \\ \text{comp}\left(S_{IN}, \dfrac{S_{REF}}{2^{N-k}} + \sum_{j=k+1}^{N-1} \dfrac{b_j}{2^{N-j}}\right) & \text{for } k \neq N-1 \end{cases}$$

where
k varies from 0 to N−1

$$\text{comp}(a, b) = \begin{Bmatrix} S_{REF} & a > b \\ 0 & a \leq b \end{Bmatrix} \text{ or } \begin{Bmatrix} S_{REF} & a \geq b \\ 0 & a > b \end{Bmatrix}$$

N=resolution of said analog to digital conversion method,
$S_{IN}$=said analog input value,
$S_{REF}$=said reference value.

5. The analog to digital conversion method of claim 4 wherein the calculation referred to by the given formula is done in software.

6. The analog to digital conversion method of claim 4 wherein the calculation referred to by given formula is performed using a microprocessor, a microcontroller, or a programmable logic array.

7. The analog to digital conversion method of claim 4 wherein the calculation referred to by given formula is performed using electrical circuits including integrated circuits.

8. The analog to digital conversion method of claim 4 wherein the calculation referred to by the given formula is performed by nano devices.

9. The analog to digital conversion method of claim 4 wherein the calculation referred to by the given formula is performed in a single semiconductor device with input terminals for power supply, an input terminal for analog value and an input terminal for reference value and N output terminals for N-bit digital output.

10. The analog to digital conversion method according to claim 3 or claim 4 wherein said analog input value is derived by sampling an analog signal.

11. The analog to digital conversion method in claim 10 wherein said digital value is stored in a latch after each conversion.

12. The analog to digital conversion method of claim 10 wherein values represent any physical quantity including but not limited to voltage, current, charge, light intensity, magnetic field intensity, value of a variable in a software etc.

13. A method of converting an analog value into an equivalent digital value based on a given reference value comprising:
   a. providing a set of functional units, each such unit receiving said analog value, said reference value and a first set of parametric inputs and deriving values of a preassigned set of output bits which form part of said equivalent digital value;
   b. providing a means for connecting said functional units in an arrangement such that each such functional unit using said first set of parametric inputs receives the output bits from a subset of functional units which are assigned to derive output bits of higher significance than that derived by the functional unit in question;

wherein said first function, which defines the relationship between inputs and outputs of $i^{th}$ functional unit can be expressed as:

$$b_k = \begin{cases} \text{comp}\left(S_{IN}, \frac{S_{REF}}{2}\right) & \text{for } k = N-1 \\ \text{comp}\left(S_{IN}, \frac{S_{REF}}{2^{N-k}} + \sum_{j=k+1}^{N-1} \frac{b_j}{2^{N-j}}\right) & \text{for } k \neq N-1 \end{cases}$$

where, $k$ varies from $\left(\sum_{v=1}^{i-1} m_v\right)$ to $\left(\sum_{v=1}^{i} m_v\right) - 1$ $m_v$=number of bits produced by $v^{th}$ functional unit, $$\text{comp}(a, b) = \begin{cases} S_{REF} & a > b \\ 0 & a \leq b \end{cases} \text{ or } \begin{cases} S_{REF} & a \geq b \\ 0 & a > b \end{cases}$$

N=resolution of said analog to digital conversion method, $S_{IN}$=said analog input value, $S_{REF}$=said reference value;

thereby each such functional unit will derive said set of output bits as a first function of said analog value, said reference value and values of said first set of parametric inputs corresponding to output bits of other functional units to which the functional unit in question is connected to.

14. The method of analog to digital conversion in claim 13 wherein each functional unit is an analog to digital converter capable of converting an analog value into an equivalent digital value.

15. The analog to digital conversion method according to claim 13 wherein said analog value, said reference value, said equivalent digital value, values of said digital inputs, values of said output bits, value of said partial sum are any physical quantity including but not limited to voltage, current, charge, light intensity etc.

16. The method in claim 13 wherein each functional unit defined by the said function can accept values in terms of any physical quantity.

17. The analog to digital conversion method according to claim 13 wherein each functional unit further comprising:
   c. a first set of scaling units corresponding to each said first parametric inputs of said functional unit scaling analog values of each parametric input by a factor corresponding to significance of said parametric input in said equivalent digital value to generate a corresponding first set of scaled analog values;
   d. a first summing unit summing all of said first set of scaled analog values to produce a partial sum;
   e. a set of subunits, each such subunit receiving said analog value, said reference value, a second set of parametric inputs and said partial sum from said first summing unit and deriving the values of a bit which form part of said output bits of said functional unit;
   f. an arrangement connecting said subunits such that each such subunit using said second set of parametric inputs receives the output bits from a subset of subunits within said functional unit, each deriving bits of higher significance than that derived by the subunit in question;

thereby each subunit will derive the value of said bit as a second function of said analog value, said reference value, value of said partial sum and values of said second set of parametric inputs corresponding to values of output bits derived by other subunits to which the subunit in question is connected to.

18. The analog to digital conversion method in claim 17 wherein, the second function that defines the relationship between inputs and outputs of $u^{th}$ subunit inside $i^{th}$ functional unit can be expressed as:

$$b_k = \begin{cases} \text{comp}\left(S_{IN}, \frac{S_{REF}}{2}\right) & \text{for } k = N-1 \\ \text{comp}\left(S_{IN}, \frac{S_{REF}}{2^{N-k}} + \sum_{j=k+1}^{N-1} \frac{b_j}{2^{N-j}}\right) & \text{for } k \neq N-1 \end{cases}$$

where, $k = \left(\sum_{v=1}^{i-1} m_v\right) + u - 1,$ $m_v$=number of bits produced by $v^{th}$ functional unit, i=index of parent functional unit, $\Sigma$=said partial sum from parent functional unit, $$\text{comp}(a, b) = \begin{cases} S_{REF} & a > b \\ 0 & a \leq b \end{cases} \text{ or } \begin{cases} S_{REF} & a \geq b \\ 0 & a > b \end{cases},$$

N=resolution of said analog to digital conversion method, $S_{IN}$=said analog input value, $S_{REF}$=said reference value.

19. The method of analog to digital conversion in claim 17 wherein each subunit is capable of performing analog to digital conversion.

20. The method of analog to digital conversion according to claim 17 wherein each subunit further comprising:
   c. a second set of scaling units corresponding to each of said second set of parametric inputs of said subunit scaling analog values of each such parametric input by a factor corresponding to the significance of said parametric input in said equivalent digital value to generate a corresponding second set of scaled analog values;

d. a scaling unit scaling said reference value by a factor corresponding to the significance of said bit produced by said subunit in question generating a scaled reference value;

e. a second summing unit summing all of said second set of scaled analog values, said scaled reference value and the value of said partial sum to produce an overall sum;

f. a comparison unit comparing said overall sum with said analog value to produce a value equal to said reference value if said analog value is greater than said overall sum and producing a value equal to zero if said analog value is smaller than said overall sum;

thereby said value produced by said comparator becoming said bit of said subunit and said bit of said subunit becoming a part of said set of output bits of said functional unit and said output bits of said functional unit becoming part of said equivalent digital value produced by overall conversion method.

21. An analog to digital converter converting an analog value into a digital value based on a reference value, the analog to digital converter comprising:

a set of comparators connected in a special arrangement such that each such comparator performs a one bit analog to digital conversion producing a single output bit based on a set of parameters directly set by analog values of output bits of all other comparators which produce bits of higher significance;

wherein each comparator is assigned to produce a single bit as a part of said digital value;

wherein each comparator is designed to perform parametric comparison by comparing said analog value with a sum of scaled values of all of said set of parameters and a scaled value of said reference value such that each parameter is scaled by a factor based on its significance in the said digital value and said reference value is scaled by a factor corresponding to the significance of said bit produced by said comparator in question.

22. An analog to digital converter according to claim 21 wherein $k^{th}$ comparator producing the value of $k^{th}$ bit $b_k$ performs comparison according to a rule which can be mathematically expressed as:

$$b_k = \begin{cases} \text{comp}\left(S_{IN}, \frac{S_{REF}}{2}\right) & \text{for } k = N-1 \\ \text{comp}\left(S_{IN}, \frac{S_{REF}}{2^{N-k}} + \sum_{j=k+1}^{N-1} \frac{b_j}{2^{N-j}}\right) & \text{for } k \neq N-1 \end{cases}$$

where, k=0 to N−1, $$\text{comp}(a, b) = \begin{cases} S_{REF} & a > b \\ 0 & a \leq b \end{cases} \text{ or } \begin{cases} S_{REF} & a \geq b \\ 0 & a > b \end{cases},$$

N=resolution of said analog to digital conversion method, $S_{IN}$=said analog input value, $S_{REF}$=said reference value.

23. An analog to digital converter according to claim 21 wherein said analog value and said digital value represents any physical quantity including voltage, current, charge, light intensity etc.

24. An analog to digital converter according to claim 23 wherein analog to digital conversion is performed in asynchronous mode such that each comparator will be converting analog values sampled at different instant of time and output bits of each comparator is buffered for a number of cycles as to complete the conversion.

25. An analog to digital converter according to claim 21 wherein said analog value is a sample from an analog signal.

26. An analog to digital converter according to claim 21 wherein said analog value is instantaneous value of an analog signal.

27. An analog to digital converter according to claim 26 wherein said digital value is filtered using digital signal processing unit.

* * * * *